(12) United States Patent
Schrom et al.

(10) Patent No.: US 7,208,963 B2
(45) Date of Patent: Apr. 24, 2007

(54) METHOD AND APPARATUS FOR MEASURING COIL CURRENT

(75) Inventors: Gerhard Schrom, Hillsboro, OR (US); Peter Hazucha, Beaverton, OR (US); Donald S. Gardner, Mountain View, CA (US); Vivek K. De, Beaverton, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/977,145

(22) Filed: Oct. 29, 2004

(65) Prior Publication Data

US 2006/0091896 A1 May 4, 2006

(51) Int. Cl.
*G01R 27/08* (2006.01)
*G01R 27/10* (2006.01)

(52) U.S. Cl. .................. 324/713; 324/126; 324/127

(58) Field of Classification Search ................ 324/713, 324/126, 127
See application file for complete search history.

(56) References Cited

U.S. PATENT DOCUMENTS

| | | | | |
|---|---|---|---|---|
| 5,053,697 A | * | 10/1991 | Carnel et al. ................ 324/142 |
| 5,298,857 A | * | 3/1994 | Voisine et al. ............... 324/142 |
| 5,696,441 A | * | 12/1997 | Mak et al. .................... 324/115 |
| 6,043,641 A | * | 3/2000 | Singer et al. ................ 324/127 |
| 2004/0246226 A1 | * | 12/2004 | Moon .......................... 345/102 |

* cited by examiner

*Primary Examiner*—Andrew H. Hirshfeld
*Assistant Examiner*—John Zhu

(57) ABSTRACT

A method and apparatus is described according to various embodiments, for flowing current from one region of a coil to another region of the coil. The flowing induces—through flux linkage —a voltage across a second coil. A second current substantially does not flow though the second coil. The method and apparatus also includes measuring the current with the voltage between the two coils.

25 Claims, 4 Drawing Sheets

METHOD AND APPARATUS FOR MEASURING COIL CURRENT

FIELD OF THE INVENTION

The field of invention relates generally to electronic circuit design; and, more specifically, to a method and apparatus for measuring coil current.

BACKGROUND

FIG. 1 shows a lumped element model for a coil of wire. A coil of wire (or simple, "a coil") is wiring that forms one or more loops as it progresses forward (e.g., a rectangular or circular spiral of wire). Coils are most often used for electronic components, such as inductors and transformers, that make use of magnetic fields. The lumped element model of FIG. 1 includes an inductor L that represents the inductance of the coil and a resistance R that represents the series resistance of the coil.

Both the inductance L and the resistance R increase as the number of windings (i.e., the number of loops) that the coil is comprised of increases. With respect to inductance, which is a metric related to the core's ability to store magnetic field energy, more windings corresponds to the creation of a greater magnetic field strength (and corresponding magnetic flux density) within the region encompassed by the coil's loops. With respect to resistance, which is a metric related to the amount of electrical energy that an electrical current will expend as it flows through the coil, more windings corresponds to a longer path that a current that flows through the coil must travel.

When a time varying current "i(t)" is driven through the coil, there will be a voltage drop across the entire coil $V_C = V_L + V_R$ where $V_L$ is the voltage drop across the inductive component L of the coil and $V_R$ is the voltage drop across the resistive component R of the coil. Here, $V_L = L(\partial i(t)/\partial t)$ and $V_R = i(t)R$ where L is the inductance of the coil, R is the resistance of the coil and $(\partial i(t)/\partial t)$ is "the first derivative with respect to time" of the current i(t). The first derivative with respect to time of the current i(t) describes the rate of change of the current i(t) over time. As such, for example, if the current i(t) is a triangular waveform, the voltage drop over the inductive component of the coil $V_L$ will be a rectangular waveform (owing to the $(\partial i(t)/\partial t)$ term).

Known techniques for measuring the current i(t) through a coil involves the addition of a small series resistance along the same current path that i(t) flows. The voltage drop across the small series resistance is measured and correlated to the coil current i(t). A problem, however, is that the measured voltage "signal" across the added series resistance is small because the added series resistance itself is small (e.g., to reduce the power consumption). Because the measured voltage signal is small, a voltage amplifier with large gain is used to help perform the overall correlation between the measured voltage and the coil current.

Unfortunately, voltage amplifiers with large gain have low bandwidth (owing to a amplifier characteristic known in the art as "gain-bandwidth product"). As such, the ability to accurately measure i(t) becomes less and less practicable as the time rate-of-change of i(t) increases. For example, if i(t) is an oscillating signal such as an oscillating sinusoid or triangular waveform, the ability to measure i(t) becomes less and less practicable with increasing frequency of oscillation.

FIGURES

The present invention is illustrated by way of example and not limitation in the figures of the accompanying drawings, in which like references indicate similar elements and in which.

Figure 5:
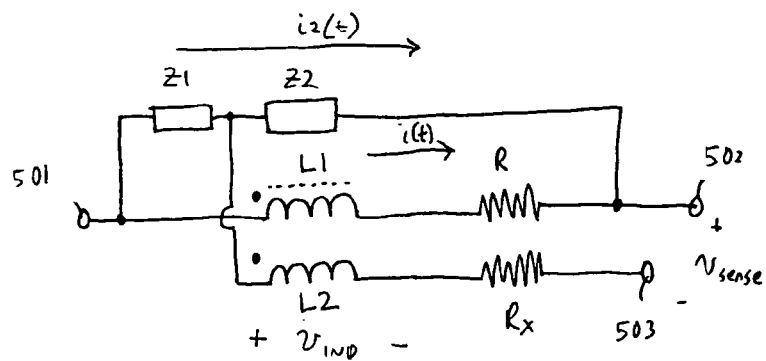
FIG. 5 shows another lumped element circuit model for a circuit that measures the current through an inductor by way of a flux linked inductor.
Figure 6:
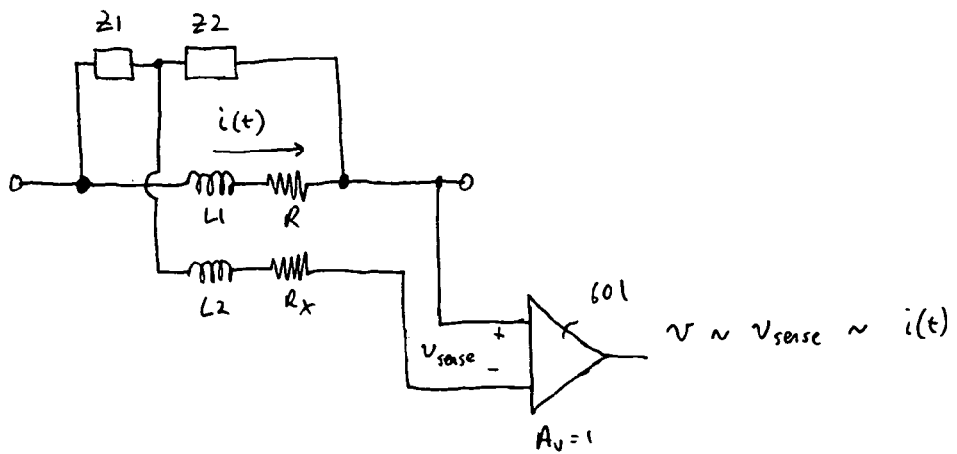
Figure 7:
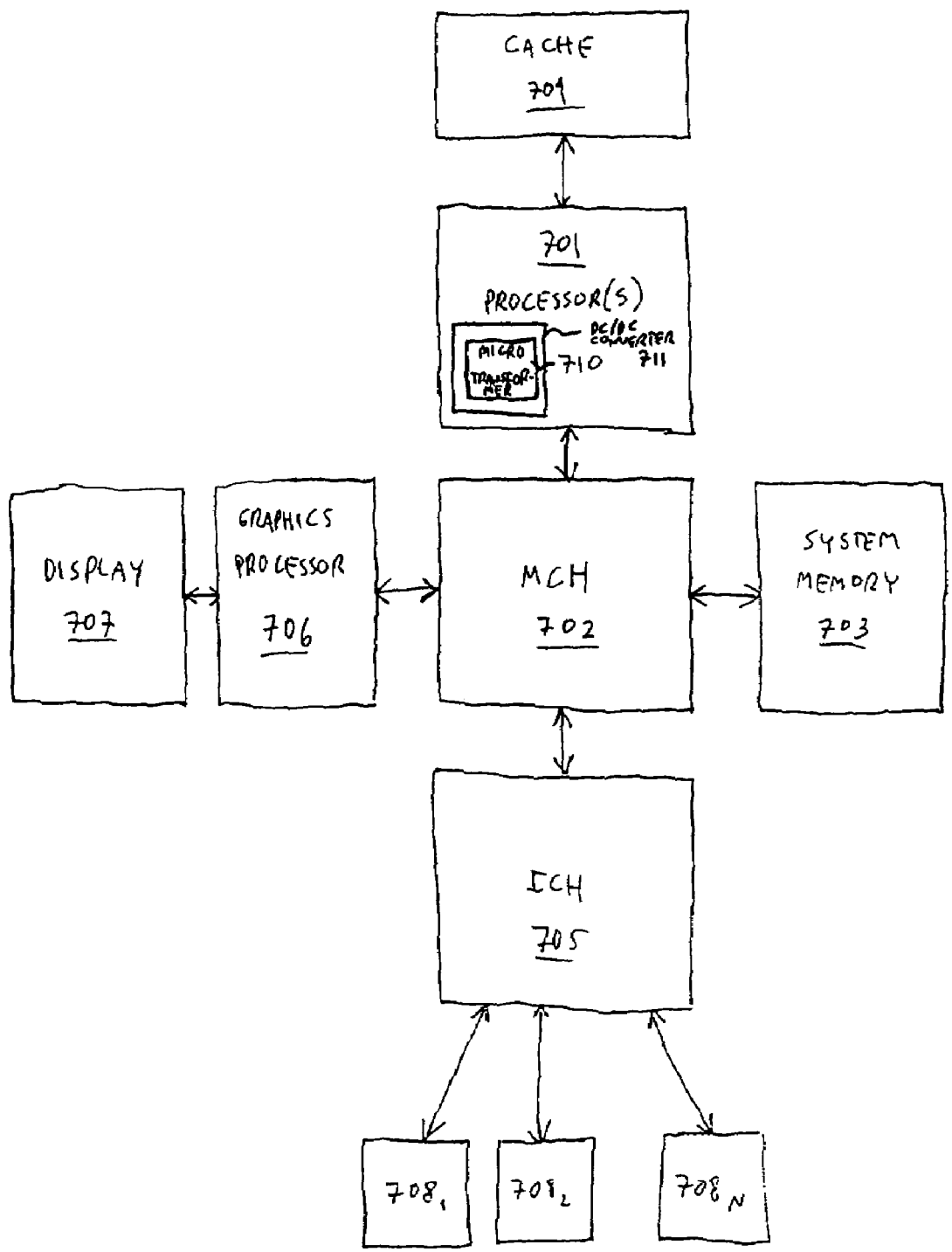

FIG. 6 amplifier circuitry integrated with the model of FIG. 5 that provides an output signal that varies as i(t);

FIG. 7 shows a computing system whose processor(s) include a DC-DC converter that includes a micro-transformer configured to provide a current measurement signal generated by current measurement techniques described herein.

DESCRIPTION

Figure 1:
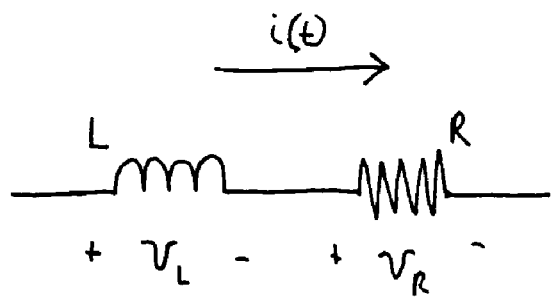
FIG. 1 shows a lumped element circuit model for a coil.
Figure 2:
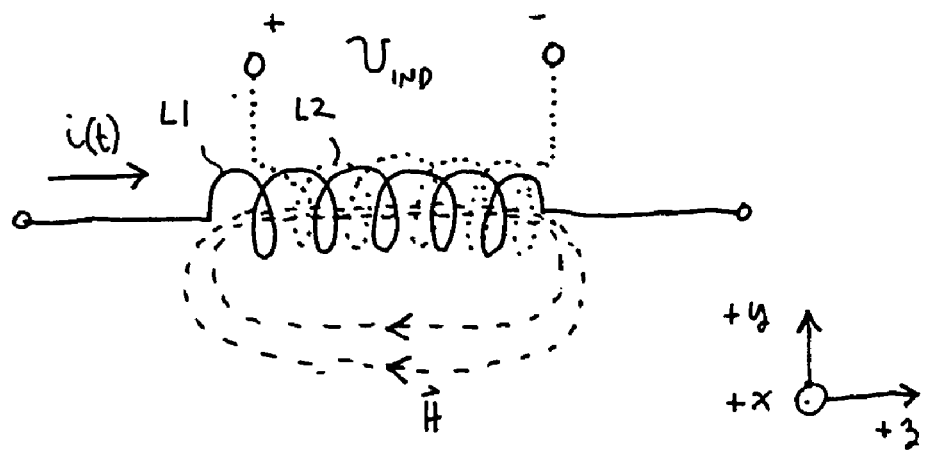
FIG. 2 shows a pair of flux linked coils.

A solution to the problem described in the background is to measure the current through a coil with an inductor that is flux linked with the coil's inductance. FIG. 2 shows a pair of flux linked coils L1, L2. Flux linked coils are coils positioned so that the magnetic flux lines generated by a first coil (e.g., by driving current through it) cross through the one or more surface areas bounded by the respective one or more loops formed by the second coil.

Here, coil L1 is the coil whose current i(t) is desired to be measured. An artifact of the flux linkage between coils L1 and L2 is that the current flow i(t) through coil L1 induces a voltage $v_{IND}$ across coil L2. The induced voltage $v_{IND}$ across coil L2 can be used as a basis for determining the current i(t) through coil L1. Before explaining various embodiments of measuring i(t) through a flux linked inductor, however, the generation of the induced voltage $v_{IND}$ will first be described.

FIG. 2 shows a magnetic flux linkage approach in which the spiraled coil winding represented by L1 is interleaved with the spiraled coil winding represented by L2. The current i(t) through the L1 coil generates a family of magnetic field vectors H that, as observed in FIG. 2, close upon themselves (circulate) and run both through the loops of the L1 and L2 coils as well as outside the loops of the L1 and L2 coils. The strength of the field H increases as the magnitude of i(t) increases and the number of loops of the L1 coil increases.

The response of any medium to an applied magnetic field H is the creation of a magnetic flux density B. Here, $B = \mu H$, where, $\mu$ is the "permeability" of the medium and represents the medium's ability to generate magnetic flux B from an applied H field. A non magnetic medium such as "air" will generally have a low permeability—indicating that sparse magnetic flux density B results from an applied magnetic field H. Highly magnetic materials (such as permalloy), by contast, have high permeability—indicating that dense magnetic flux density B results from the applied magnetic field H. Often, the medium bounded by a coil's loops will be of a high permeability to increase the magnetic flux density that is bounded by the coil's loops.

Because L1 is interleaved with L2, the resultant magnetic flux density lines that run through the loops of L1 will also run through the loops of L2. Moreover, if i(t) is time varying, the resultant magnetic field intensity H and its corresponding magnetic flux density B will also be time varying.

When a time varying magnetic flux density crosses through the surface area bounded by a loop of wire, an electric field and corresponding voltage is induced around the loop. As such, because a time-varying magnetic flux density crosses through the surface area bounded by each of the respective loops of the L2 coil, a voltage is induced around each loop of the L2 coil. The combined result is the induced voltage $v_{IND}$ across the L2 coil as whole.

Generally then, the greater the number of windings in L1 (stronger H field) and L2 (greater induced voltage) and the greater the permeability of the medium bounded by the loops of L1 and L2, the greater the induced voltage $v_{IND}$ across inductor L2. It is important to emphasize that flux linkage can be accomplished with a wide variety of structures other than the interleaved coils observed in FIG. 2. Nevertheless, the flux linkage mechanism should be consistent with basic principles of flux linkage such as those described just above.

Figure 3:
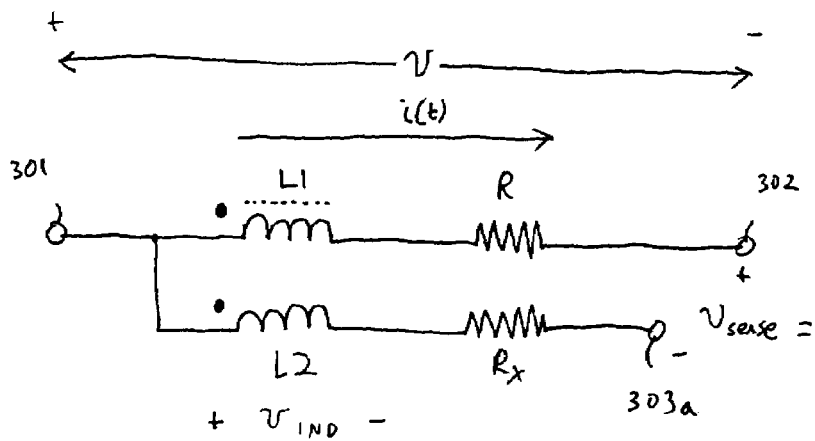
FIG. 3 shows a lumped element circuit model for a circuit that measures the current through an inductor by way of a flux linked inductor.

FIG. 3 shows a circuit model for a current measurement technique that measures current through a first inductor L1 using flux linkage with a second inductor L2. Here, the flux linkage between the two inductors L1, L2 correlates with the definition of flux linkage between two coils as provided above. That is, flux linked inductors are inductors positioned so that the magnetic flux lines generated by a first inductor (e.g., by driving current i(t) through it) cross through the one or more surface areas bounded by the respective one or more loops of the second inductor.

According to the circuit model of FIG. 3, the current i(t) through any element capable of being modeled as an inductor L1 and resistor R in series (such as a coil) is measured by way of another, second inductor L2 that is flux linked with the first inductor L1. The induced voltage across the second inductor L2 is used to create a voltage signal $v_{SENSE}$ across nodes 302 and 303 that is correlated to the current i(t).

In order to effect correlation between voltage signal $v_{SENSE}$ and current i(t), the less current that flows through node 303, the better. Ideally, no current flows through 303. Here, the drawing of little or no current through node 303 by voltage amplification or voltage follower circuitry that processes the $v_{SENSE}$ signal will be straight forward to those of ordinary skill. For example, voltage amplification or follower circuitry that imposes a high input impedance through the L2 coil (e.g., 50 Ohm or higher) relative to the impedance through the L1 coil could be used to effectively thwart current draw from node 303.

Note that, among equal open loop amplifier designs, an amplifier configured as a voltage follower (i.e., unity gain) will have the higher bandwidth owing to the amplifier's gain-bandwidth product. Therefore, generally, the higher the frequency of the $v_{SENSE}$ signal, if an amplifier is to be coupled to nodes 302, 303, the designer should consider an amplifier having sufficiently high gain-bandwidth product and sufficiently low amplification.

A discussion of the theory behind the operation of the circuit model of FIG. 3 immediately follows. "Zero current" through node 303 is assumed. With zero current flowing through node 303, 100% of current i(t) entering node 301 will flow through node 302. The voltage drop v across nodes 301 and 302 will therefore be the summation of the voltage drop across inductor L1 and resistance R. That is, $$v = L1\ (\partial i(t)/\partial t) + i(t)R. \qquad \text{EQN. 1}$$

Rearranging terms yields $$L1(\partial i(t)/\partial t) = v_L = v - i(t)R. \qquad \text{EQN. 2}$$

Because of the magnetic flux linkage between L1 and L2, a voltage $v_{IND}$ that is proportional to $\partial i(t)/\partial t$ will be induced across inductor L2. That is, $$v_{IND} = k'(\partial i(t)/\partial t) \qquad \text{EQN. 3}$$

where k' is a figure of merit in units of Henries that describes the strength of the magnetic flux coupling between L1 and L2. At least for coil wound inductors, as described with respect to FIG. 2, a theoretical breakdown of the terms from which k' is comprised should at least include the number of windings of L2 and the permeability μ of the medium around which the windings of L2 turn. Substituting EQN. 3 into EQN. 2 to solve for $v_{IND}$ yields $$v_{IND} = (k'/L1)(v - i(t)R) = k(v - i(t)R). \qquad \text{EQN. 4}$$

where k=k'/L1. With the current draw at node 303 being zero, $$v = v_{IND} + v_{SENSE} = k(v - i(t)R) + v_{SENSE} \qquad \text{EQN. 5}$$

or, $$v_{SENSE} = v - k(v - i(t)R) \qquad \text{EQN. 6}$$

which can be rearranged as, $$i(t) = (v_{SENSE} + (k-1)v)/R. \qquad \text{EQN. 7}$$

From EQN. 7 note that v and $v_{SENSE}$ can be easily measured, and that, k and R are "knowns" from the design of the circuit. Therefore the current through inductor L1 can be determined outright. Note also that the resistance Rx appears nowhere in EQN. 7 owing to the current draw through node 303 being deemed zero.

Figure 4:
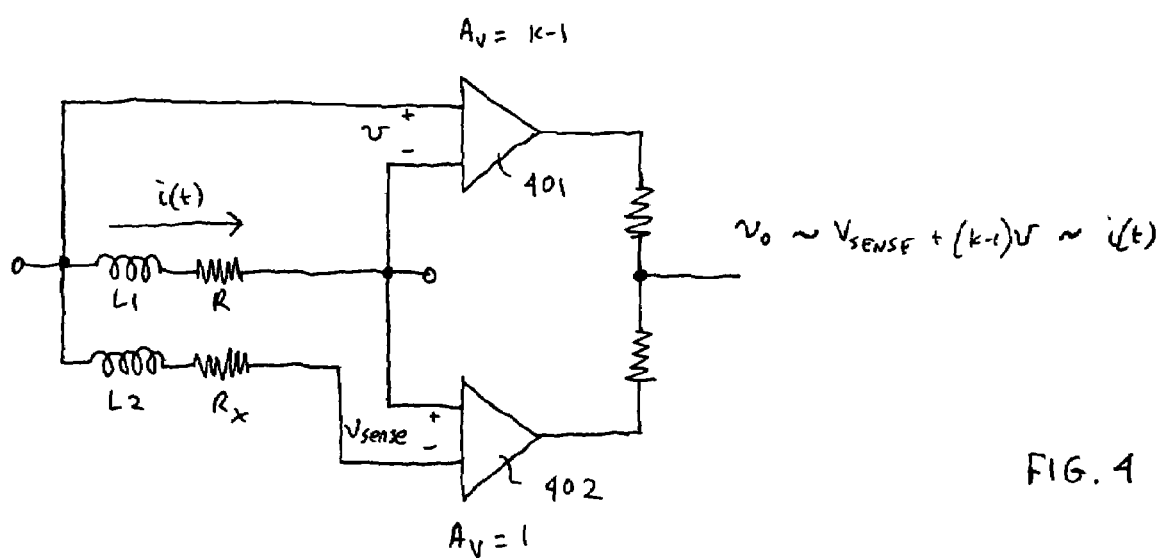
FIG. 4 shows amplifier circuitry integrated with the model of FIG. 3 that provides an output signal that varies as i(t)

FIG. 4 shows amplification circuitry coupled to the model of FIG. 3 whose ultimate output signal is a voltage signal vo that varies as i(t). According to the amplification circuitry of FIG. 4, amplifier 401 amplifies v with a gain of k−1 and amplifier 402 amplifies $v_{SENSE}$ with a gain of 1. Thus, the output voltage of amplifier 401 is (k−1)v and the output voltage of amplifier 402 is $v_{SENSE}$. Summing the output voltages of amplifiers 401, 402 as shown produces an output signal vo which varies as ($v_{SENSE}$+(k−1)v; which, from EQN. 7, varies as i(t).

FIG. 5 shows an improved circuit in which a voltage divider network formed with impedances Z1 and Z2 is shunted across the element modeled as series inductance L1 in series with resistance R. Here, again with the current through node 503 being zero, no current is drawn from between impedances Z1 and Z2.

As such, a current path i2 exists through impedances Z1 and Z2 where v=i2(Z1+Z2)=i2Z (i.e., Z=Z1+Z2). In the embodiment of FIG. 5, Z1=(1−k)Z and Z2=kZ to force the voltage drop across Z1 to be (1−k)v. Moreover, $$v = v_{IND} + v_{SENSE} + (1-k)v \qquad \text{EQN. 8}$$

which can be restated as, $$v_{SENSE} = v - k(v - i(t)R) - v + kv \qquad \text{EQN. 9}$$

which can be restated as, $$i(t) = v_{SENSE}/kR. \qquad \text{EQN. 10}$$

Here, EQN. 10 demonstrates that the circuit of FIG. 5 forces $v_{SENSE}$ itself to be directly proportional to i(t) through knowns k and R. As such, i(t) can be determined through measurement of $v_{SENSE}$ rather than through measurement of v and $v_{SENSE}$.

FIG. 6 shows amplification circuitry coupled to the model of FIG. 5 whose ultimate output signal is a voltage signal vo that varies as i(t). Here, the amplification circuitry includes a single unity gain amplifier 601. Compared with the circuitry of FIG. 4, not only is the circuitry of FIG. 6 less complicated but also should have higher bandwidth because only unity gain amplification is performed.

A transformer is commonly used to change a first power supply voltage to a second power supply voltage without crossing electrical current paths between the two supplies. A first coil is magnetic flux linked to a second coil. Typically, the pair of coils are wound across the same magnetic medium to enhance the magnetic flux coupling between them. A first supply voltage is applied to the first coil, and, a second supply voltage is induced across the second coil.

Recently, in order to address power consumption problems and/or to change supply voltage levels on semiconductor chips, "on die" transformers (i.e., "micro-transformers") have been developed (e.g., as part of an "on-die" DC/DC converter). A micro-transformer is a transformer that is constructed with a semiconductor chip manufacturing process. Here, a semiconductor chip's metallization is designed to include metal strips and layers of magnetic material that effectively form coils that wind around a magnetic core.

Thus, an application of the aforementioned current measurement circuitry is the measuring of current through the coil of a micro-transformer. Here, inductor L1 and R correspond to a micro-transformer coil and L2 and Rx correspond to another coil that is flux linked with the L1/R coil (e.g., be being interwoven within the micro-transformer). The amplification circuitry can be readily designed into the semiconductor chip's circuit design.

FIG. 7 shows an embodiment of a computing system. The exemplary computing system of FIG. 7 includes: 1) one or more processors 701 having a DC-DC converter 711 that includes a micro-transformer 710; 2) a memory control hub (MCH) 702; 3) a system memory 703 (of which different types exist such as DDR RAM, EDO RAM, etc,); 4) a cache 704; 5) an I/O control hub (ICH) 705; 6) a graphics processor 706; 7) a display/screen 707 (of which different types exist such as Cathode Ray Tube (CRT), Thin Film Transistor (TFT), Liquid Crystal Display (LCD), DPL, etc.; 8) one or more I/O devices 708.

The one or more processors 701 execute instructions in order to perform whatever software routines the computing system implements. The instructions frequently involve some sort of operation performed upon data. Both data and instructions are stored in system memory 703 and cache 704. Cache 704 is typically designed to have shorter latency times than system memory 703. For example, cache 704 might be integrated onto the same silicon chip(s) as the processor(s) and/or constructed with faster SRAM cells whilst system memory 703 might be constructed with slower DRAM cells.

By tending to store more frequently used instructions and data in the cache 704 as opposed to the system memory 703, the overall performance efficiency of the computing system improves. System memory 703 is deliberately made available to other components within the computing system. For example, the data received from various interfaces to the computing system (e.g., keyboard and mouse, printer port, LAN port, modem port, etc.) or retrieved from an internal storage element of the computing system (e.g., hard disk drive) are often temporarily queued into system memory 703 prior to their being operated upon by the one or more processor(s) 701 in the implementation of a software program.

Similarly, data that a software program determines should be sent from the computing system to an outside entity through one of the computing system interfaces, or stored into an internal storage element, is often temporarily queued in system memory 703 prior to its being transmitted or stored. The ICH 705 is responsible for ensuring that such data is properly passed between the system memory 703 and its appropriate corresponding computing system interface (and internal storage device if the computing system is so designed). The MCH 702 is responsible for managing the various contending requests for system memory 703 access amongst the processor(s) 701, interfaces and internal storage elements that may proximately arise in time with respect to one another.

One or more I/O devices 708 are also implemented in a typical computing system. I/O devices generally are responsible for transferring data to and/or from the computing system (e.g., a networking adapter); or, for large scale non-volatile storage within the computing system (e.g., hard disk drive). ICH 705 has bi-directional point-to-point links between itself and the observed I/O devices 708.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A current measuring apparatus, comprising:
   a) a coil, said coil to conduct current from one region of said coil to another region of said coil; and,
   b) a current measurement circuit to measure current through said coil comprising:
      i) a second coil that is flux linked to said first coil, a first region of said second coil physically coupled to said one region of said coil;
      ii) a circuit having a first input coupled to said another region of said coil, and, a second input coupled to a second region of said second coil, said second input having an input impedance to substantially prevent current flow from said first region of said second coil to said second region of said second coil.

2. The apparatus of claim 1 wherein said input impedance is greater than 50 Ω.

3. The apparatus of claim 1 wherein said circuit comprises an amplifier, said amplifier having said first input and said second input.

4. The apparatus of claim 3 wherein said amplifier is a unity gain amplifier.

5. The apparatus of claim 1 further comprising a pair of impedances in series shunted across said regions of said coil, said first region of said second coil coupled to said one region of said coil through a first of said impedances and a node between said impedances, said first impedance coupled at an end opposite said node to said one region of said coil.

6. The apparatus of claim 5 wherein said first impedance has an impedance of a (1−k)Z and a second impedance of said pair of impedances has an impedance of kZ where Z is the impedance of said first and second impedances and where k is proportional to the strength of said flux linkage.

7. The apparatus of claim 1 wherein said coil is part of a micro-transformer.

8. The apparatus of claim 7 wherein said input impedance is greater than 50 Ω.

9. The apparatus of claim 7 wherein said circuit comprises an amplifier, said amplifier having said first input and said second input.

10. The apparatus of claim 7 further comprising a pair of impedances shunted across said regions of said coil, said first region of said second coil coupled to said one region of said coil through a first of said impedances and a node between saidimpedances, said first impedance coupled at an end opposite said node to said one region of said coil.

11. The apparatus of claim 10 wherein said first impedance has an impedance of a (1−k)Z k)Z and a second impedance of said pair of impedances has an impedance of kZ, where, Z is the impedance of said first and second impedances in series and where k is proportional to the strength of said flux linkage.

12. A method for measuring a current flowing from one region of a coil to another region of the coil with a second coil that is flux linked with the coil and has a first region physically coupled to the one region of the coil, the method comprising:

flowing current from one region of a coil to another region of said coil, said flowing inducing through flux linkage a voltage across said second coil, providing an impedance to substantially prevent a second current from flowing through said second coil, measuring said current with a first voltage at said another region of said coil and a second voltage at said second coil; and generating an output corresponding to said measuring.

13. The method of claim 12 wherein said measuring is performed with an amplifier.

14. The method of claim 13 wherein said amplifier is a unity gain amplifier.

15. The method of claim 12 further comprising flowing additional current through a pair of series impedances shunted across said coil's regions, said second voltage appearing at a node between said pair of impedances.

16. The method of claim 12 wherein said coil is part of a micro-transformer.

17. The method of claim 16 wherein said measuring is performed with an amplifier.

18. The method of claim 16 wherein said amplifier is a unity gain amplifier.

19. The method of claim 16 further comprising flowing additional current through a pair of series impedances shunted across said coil's regions, said second voltage appearing at a node between said pair of impedances.

20. A current measuring computing system, comprising:
   a) one or more processors comprising a DC-DC converter having a micro-transformer and a current measurement circuit to measure current in a coil of said micro-transformer, said coil to conduct current from a first region of said coil to a second region of said coil, said current measurement circuit comprising:
      i) a second coil that is flux linked to said first coil, a first region of said second coil physically coupled to said one region of said coil;
      ii) a circuit having a first input coupled to said another region of said coil, and a second input coupled to a second region of said second coil, said second input having an input impedance to approximately prevent current flow from said first region of said second coil to said second region of said second coil;
   b) a memory controller coupled to said one or more processors;
   c) a graphics processor coupled to said memory controller;
   d) an LCD display coupled to said graphics processor.

21. The apparatus of claim 20 wherein said input impedance is greater than 50 Ω.

22. The apparatus of claim 20 wherein said circuit comprises an amplifier, said amplifier having said first input and said second input.

23. The apparatus of claim 22 wherein said amplifier is a unity gain amplifier

24. The apparatus of claim 20 further comprising a pair of impedances in series shunted across said regions of said coil, said first region of said second coil coupled to said one region of said coil through a first of said impedances and a node between said impedances, said first impedance coupled at an end opposite saidone region of said coil.

25. The apparatus of claim 24 wherein said first impedance has an impedance of a (1−k)Z and a second impedance of said pair of impedances has an impedance of kZ where Z is the impedance of said first and second impedances and where k is proportional to the strength of said flux linkage.

* * * * *